United States Patent [19]

Shimizu et al.

[11] Patent Number: 5,440,149
[45] Date of Patent: Aug. 8, 1995

[54] PLANAR TYPE IMAGE SENSOR HAVING ELECTRODES ON A PHOTOELECTRIC CONVERSION LAYER

[75] Inventors: Kousaku Shimizu; Setsuo Kaneko, both of Tokyo, Japan

[73] Assignee: NEC Corporation, Tokyo, Japan

[21] Appl. No.: 234,838

[22] Filed: Apr. 28, 1994

[30] Foreign Application Priority Data

Apr. 28, 1993 [JP] Japan .................. 5-102058

[51] Int. Cl.[6] ............................................. H01L 27/14
[52] U.S. Cl. ......................................... 257/53; 257/57; 257/59; 257/72; 257/292
[58] Field of Search ................... 257/52, 53, 54, 57, 257/59, 72, 222, 294, 435, 458, 462, 291, 292, 443; 136/256

[56] References Cited

U.S. PATENT DOCUMENTS

| | | | |
|---|---|---|---|
| 4,972,252 | 11/1990 | Maekawa | 257/53 |
| 5,038,190 | 8/1991 | Ito et al. | 257/449 |
| 5,262,654 | 11/1993 | Yamazaki | 257/53 |

FOREIGN PATENT DOCUMENTS

| | | | |
|---|---|---|---|
| 60-227467 | 11/1985 | Japan | 257/54 |
| 61-85859 | 5/1986 | Japan | 257/72 |
| 3-54959 | 3/1991 | Japan | 257/72 |
| 4-145761 | 5/1992 | Japan | 257/72 |
| 4-62467 | 10/1992 | Japan | 257/72 |

*Primary Examiner*—William Mintel
*Assistant Examiner*—Minhloan Tran
*Attorney, Agent, or Firm*—Young & Thompson

[57] ABSTRACT

An image sensor of a planar type is so arranged that a photo electric conversion layer is provided on an insulating substrate, a pair of electrodes are provided on the photoelectric conversion layer, and a p-type region and an n-type region are provided to the two electrodes respectively at locations at which light incident on a surface of said photoelectric conversion layer is unintercepted. On the photo electric conversion layer, there is a transparent protective layer but there is no p+-type layer or a transparent electrode. The quantum efficiency and the blocking capability are enhanced with the leakage current being reduced.

9 Claims, 7 Drawing Sheets

PLANAR TYPE IMAGE SENSOR HAVING ELECTRODES ON A PHOTOELECTRIC CONVERSION LAYER

BACKGROUND OF THE INVENTION (1) Field of the Invention

The present invention relates to an image sensor, and more particularly to an image sensor for use in an image reading device such as a facsimile machine and a digital copying machine.

(2) Description of the Related Art

Photoelectric conversion elements used in conventional image reading devices such as facsimile machines may broadly be divided into two kinds, one being a pi-type or a pin-type in which a primary photocurrent is used and the other being an nin-type or a pip-type in which a secondary photocurrent is used. An optical sensor most common is one in which a silicon type material having a lower toxicity than in a halogen material and a high adaptability to processing is used for the photoelectric conversion layer. The photoelectric conversion element using the primary photocurrent is advantageous in that a half tone can be easily accomplished because the current value becomes proportional ($\tau \sim 1$) to the incident light intensity. However, a disadvantage therein is that, since the current value optically obtained is very low or minute, a signal-to-noise (S/N) ratio is lowered due to noise and there is attenuation in signals due to stray capacitance at a wiring intersecting portion. On the other hand, the photoelectric conversion element using the secondary photocurrent is advantageous in that the current value is higher than that obtained in a sensor using the primary photocurrent. However, a disadvantage therein is that it is difficult to detect a half tone because the current value does not easily become proportional ($\tau \sim 0.6$) to the intensity of incident light. Also, such a conventional sensor requires several or some ten milliseconds to respond to a transition from light to dark or from dark to light, and this makes it unsuited to a device such as a G4-facsimile machine which requires a shorter response time than 1 millisecond.

In a sandwiching type sensor using the primary photocurrent, a p+-layer (or an n+-layer) is formed between an upper electrode and a photoelectric conversion layer. Where the p+-type amorphous silicon film layer of 500 Angstroms is formed beneath a transparent electrode, the light that reaches the photoelectric conversion layer is reduced to less than about 70% of the light as compared with that before reaching the p+-layer due to the absorption thereof by the p+-layer. In order to solve this problem, the p+-layer is formed by using amorphous silicon carbide which has a wider bandgap than amorphous silicon.

Also, since the photocurrent obtained by photoelectric conversion is minute, it is necessary to make the current value in the dark state as low as possible in order to obtain a sufficient contrasting ratio between the light and dark. In this relation, there has been attempted to solve the problem by suppressing leakage current at an element facet, which is disclosed in a report under the title "Application of a-Si pin Photodiodes to Image Sensor" by T. Iwabuchi et al., Technical Report of the Institute of Electronics, Information and Communication Engineers, ED84-160, 1985, pp 35–40. In this attempt, the portion of the n+- (or p+-) layer on the photoelectric conversion layer, the portion protruding from the upper electrode, is etched using the upper electrode as a mask. Also, it is being studied to use individualized elements for purposes of suppressing the leakage current between adjacent picture elements (pixels), or to increase a thickness of the photoelectric conversion layer for purposes of decreasing pinhole defects and leakage current in the photoelectric conversion layer due to the lowering of blocking capabilities.

On the other hand, as disclosed in Japanese Patent Application Kokai Publication Nos. Hei 4-145761 and Hei 3-54959, studies are being conducted on image sensors of the type in which a sensor element and a blocking diode as a switching element are interconnected. A typical example of such an element is shown in schematic sectional view in FIG. 1, in which a glass substrate is designated by the numeral 11, an amorphous silicon film by 12, a p+-layer by 13, an n+-layer by 14, electrodes by 15, 51 and 52, and a protective film by 16.

In the above image sensor, the photo sensor (left half in the drawings) and the blocking diode (right half therein) are interconnected in a front-to-front form with the upper electrode 15 being used as a common electrode. In this example, the common electrode 15 has a step with a level difference of about 1 micrometer, which leads to cause the occurrence of disconnection in the interconnect, thereby lowering production yields. Also, where both the lower electrodes 52 are used as a common electrode to form a back-to-back connection, there is a high probability for the occurrence of a similar disconnection due to a step difference to develop during the process of providing leads for signals.

Also disclosed in Japanese Patent Application Kokai Publication No. Sho 61-85859 is an image sensor of the type in which a switch by means of a field effect transistor and a photo sensor are formed with a source electrode and an amorphous silicon film layer being commonly used. A typical example of such sensor is shown in schematic sectional view in FIG. 2, in which the same or similar elements as in FIG. 1 are shown in the same reference numerals. The numeral 61 denotes an insulating film and 62 denotes an electrode.

In the image sensor having the above configuration, an n+-layer is formed as a contact layer interconnecting the electrode and the amorphous silicon film. This n+-layer is formed also beneath the electrode of the diode. Therefore, this image sensor is a photo sensor using the secondary photocurrent and is a sensor in which the response time is long as already explained.

In the conventional image sensors explained above, where the primary photocurrent is used, the image sensor suffers, because it has a sandwiched structure, from disconnection to occur at portions with steps due to the film thickness being larger than about 1 micronmeter, from lowering of through-puts due to a prolonged film formation time, and from absorption of light by the taper-etched step portions and by the p+-layer or n+-layer disposed at the side at which the light is incident. These problems are also true in the image sensor in which the blocking diodes are connected in series with photo sensors.

In the sensor of the type in which the secondary photocurrent is used, the sensor element is planar but is structured in a nin-type, thus lacking a blocking layer for holes. A response time per picture element (pixel) is several to some ten milliseconds. A problem therefore is that, when it is to be operated at a high speed, the sensor cannot respond to or follow a change of images from white to black and vise versa.

SUMMARY OF THE INVENTION

An object of the present invention is, therefore, to overcome the problems existing in the prior art and to provide an image sensor in which, by making a photo sensor configured in planar, it has been made possible to enhance a quantum efficiency and a blocking capability, to reduce a leakage current, and to achieve a high through-put.

Another object of the present invention is that, in order to overcome the problem associated to disconnection at stepped wiring portions, the blocking diode for switching purposes is made planar in the same fabrication step as that for the photo sensor.

A further object of the present invention is to provide an image sensor using the primary light in which, in the image sensor having a TFT (Thin-Film-Transistor) switch and a photo sensor connected in series, a p+-layer is provided to the electrode of the sensor element at the side at which the electrode is not used in common.

According to one aspect of the invention, there is provided an image sensor of a planar type comprising:
an insulating substrate;
a photoelectric conversion layer provided on the insulating substrate;
a pair of electrodes provided on the photoelectric conversion layer; and
a p-type region and an n-type region respectively provided to the pair of electrodes at locations at which light incident on a surface of the photoelectric conversion layer is unintercepted.

In the planar pin-type photodiode according to the invention, since there is no p+-layer or transparent electrode on the photoelectric conversion layer and there is only a transparent protective layer thereon, the quantum efficiency of more than about 90% is secured at the wavelength of 570 nm whereby the leakage current can be suppressed to lower than about $10^{-14}$ A/mm$^2$. Also, since the film thicknesses can be reduced, the disconnection in stepped wiring portions which was the problem in the conventional image sensor element can be avoided. Furthermore, since the photodiode can be formed in the same fabrication step as that for the switching element such as a blocking diode and a field effect transistor, this greatly contributes to the lowering of the manufacturing cost and the enhancement of the through-put.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained hereunder with reference to the drawings.

Figure 1:
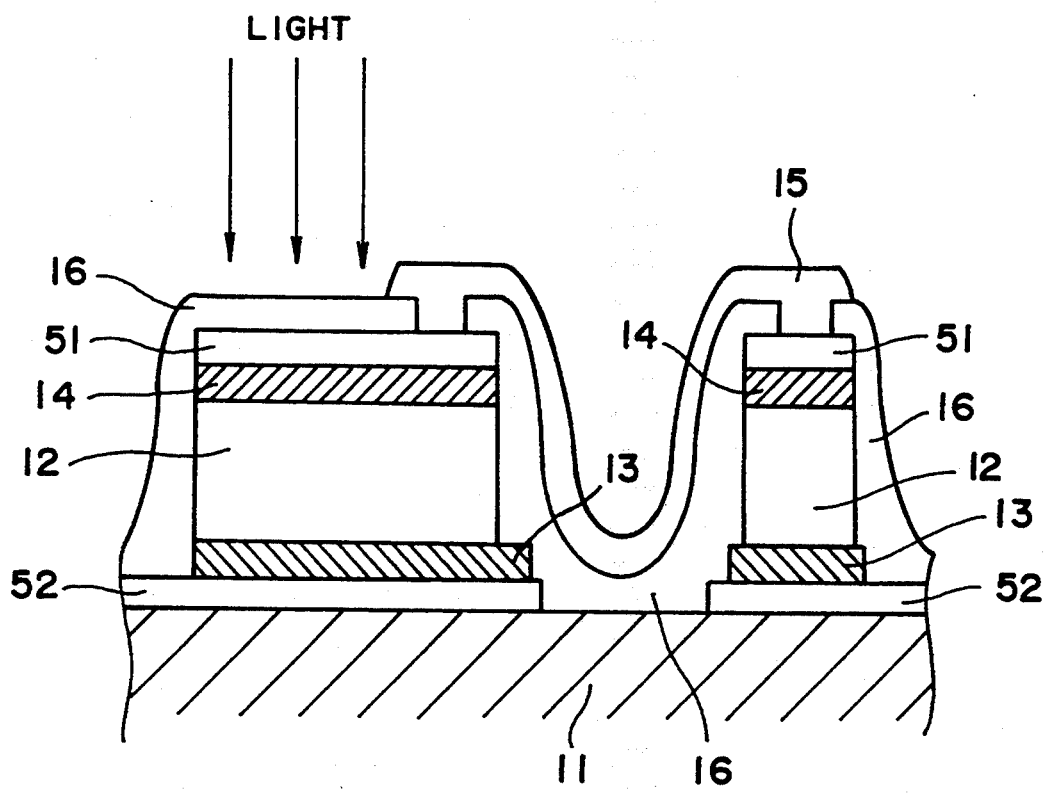
FIG. 1 is a diagrammatic sectional view of a conventional image sensor in which a blocking diode and a sensor element are simultaneously formed and interconnected.
Figure 2:
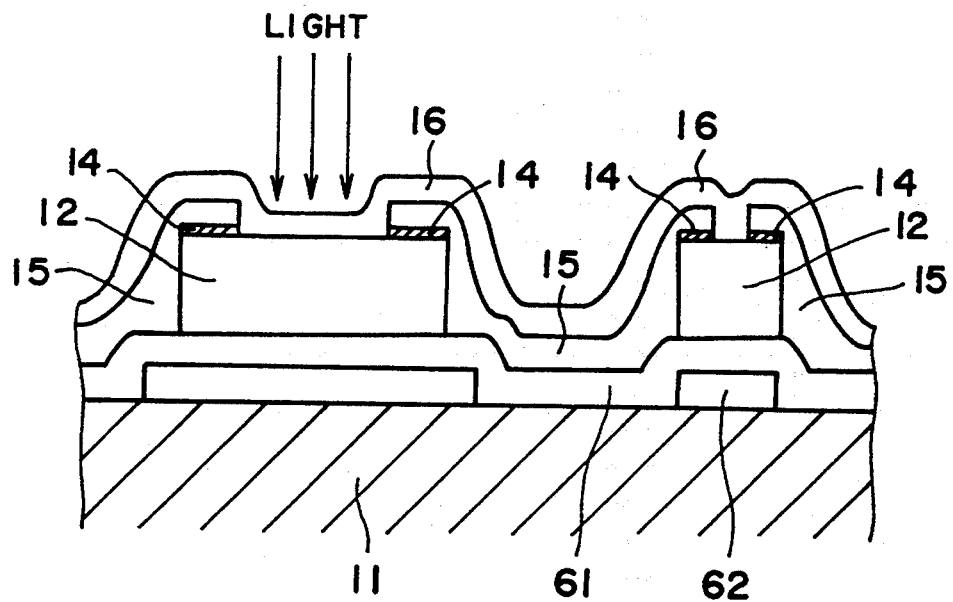
FIG. 2 is a diagrammatic sectional view of another conventional image sensor in which a field effect transistor using amorphous silicon and a sensor element of a planar type are simultaneously formed and interconnected.
Figure 3:
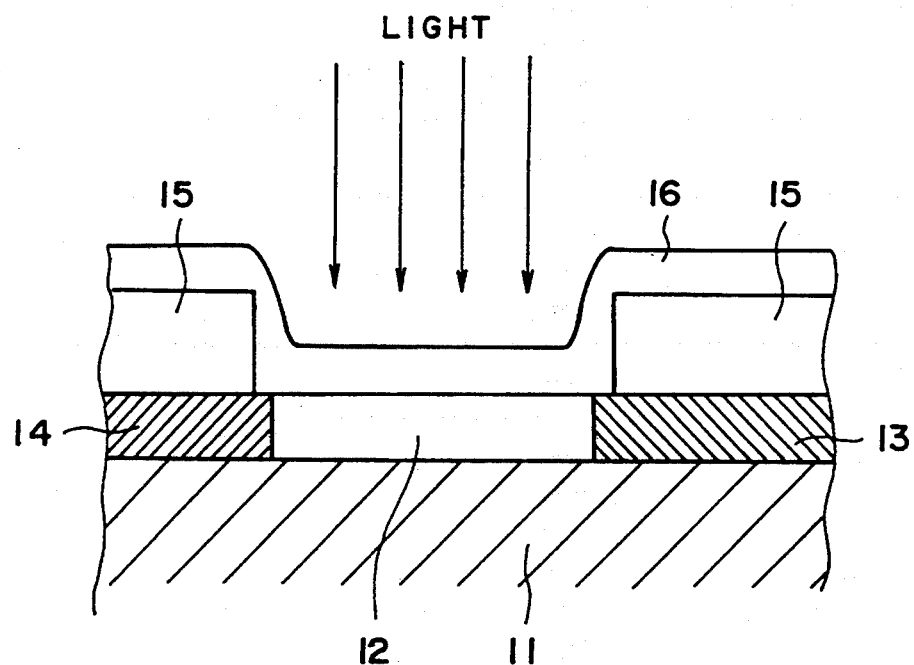
FIG. 3 is a diagrammatic sectional view of a planar pin-type image sensor device of a first embodiment according to the invention.
Figure 4:
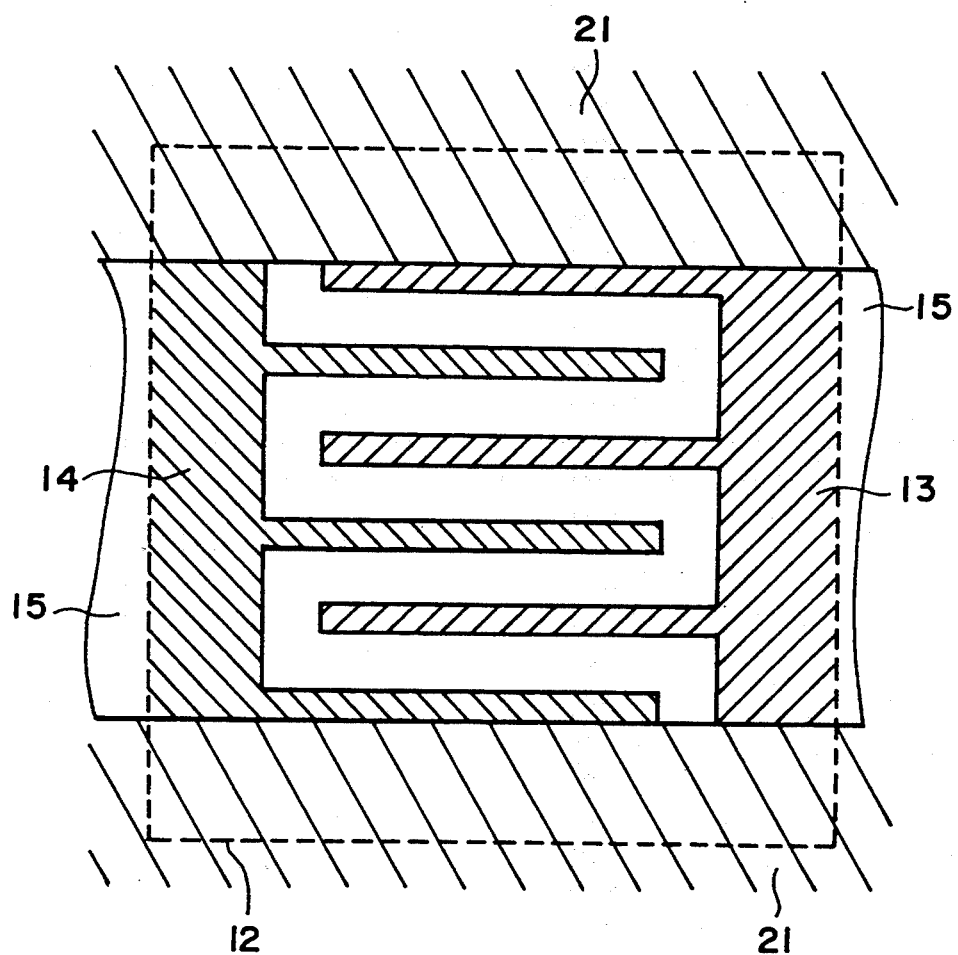
FIG. 4 is a plan view of the image sensor device of the first embodiment according to the invention.

FIGS. 3 and 4 show, respectively in a schematic sectional view and a schematic plan view, a planar pin-type image sensor element (photo sensor) of a first embodiment according to the invention. This image sensor element is fabricated through the steps explained hereinafter.

On a glass substrate 11 (Corning #7059) is formed, by a plasma-assisted Chemical Vapor Deposition (CVD) process, an amorphous silicon film 12 having a thickness of 5000 Angstroms under the conditions of gas mixing ratio (SiH$_4$/H$_2$) of 0.33, silane gas flow rate of 90 SCCM, electron discharge output power of 80 W, gas pressure of 120 Pa, and substrate temperature of 250° C. In this amorphous silicon film 12, a p+-layer 13 and an n+-layer 14 are formed. In the n+-layer 14, phosphorus (P) is ion-implanted at a dosage of $3.0 \times 10^{15}$ (ions/cm$^2$) under an accelerated voltage of 70~80 KeV, while, in the p+-layer 13, boron (B) is ion-implanted at a dosage of $3.0 \times 10^{15}$ (ions/cm$^2$) under an accelerated voltage of 28~35 KeV. In this case, the ion-implantation is made to patterns at regions 13 and 14 but the ion diffusion expands by about 500~1000 Angstroms to outwardly from the patterns. Thereafter, a chromium film of 1000 Angstroms is formed by a sputtering process under the conditions of substrate temperature of 230° C., input power of 1000 W, argon gas flow rate of 26 SCCM as sputtering gas, and gas pressure of 0.2 Pa and, then, an electrode 15 is patterned by an ordinary photoresist and etching process. In this case, the patterns are made smaller by 1~2 micrometers than the ion-implanted regions 13 and 14. As a protective film, a nitride silicon film 16 of 3000 Angstroms is formed by the plasma-assisted CVD process under the conditions of gas mixture ratio (SiH$_4$/NH$_3$) of 10, silane gas flow rate of 45

SCCM, electron discharge output power of 150 W, gas pressure of 100 Pa, and substrate temperature of 250° C. Lastly, a light blocking film 21 is formed on the protective film 16 as shown in FIG. 4. In this case, the distance between the electrodes was made 4 micronmeters and the width of each electrode was 500 micronmeters.

Figure 5:
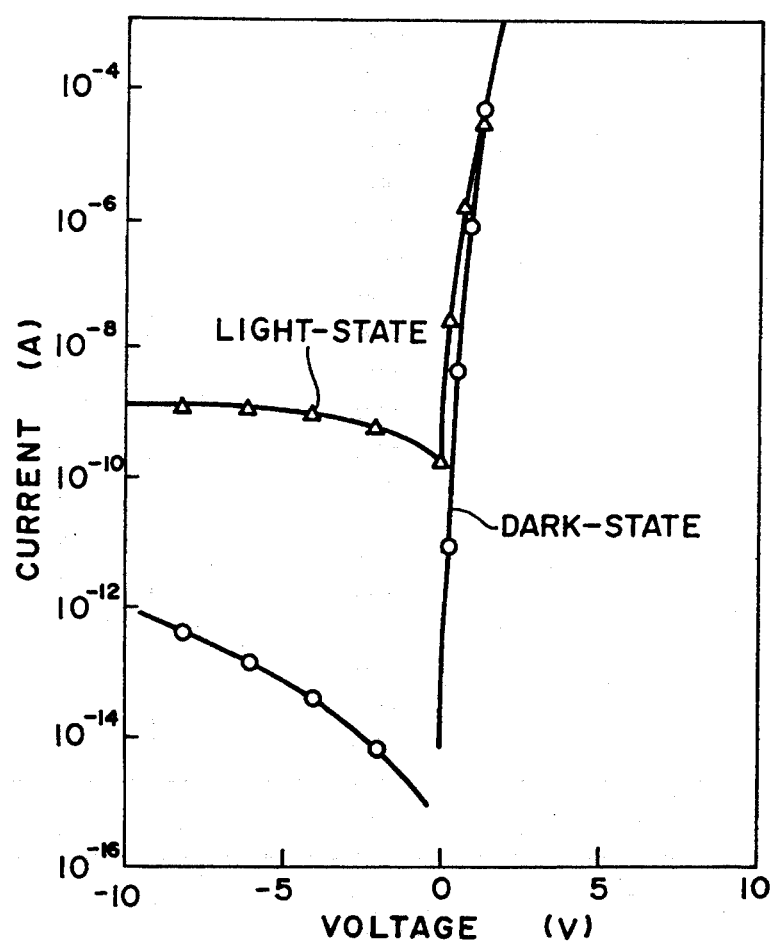
FIGS. 5 and 6 are graphs showing respectively current-voltage characteristics and quantum efficiencies observed at a light state and a dark state respectively of the image sensor element of the first embodiment according to the invention.
Figure 6:
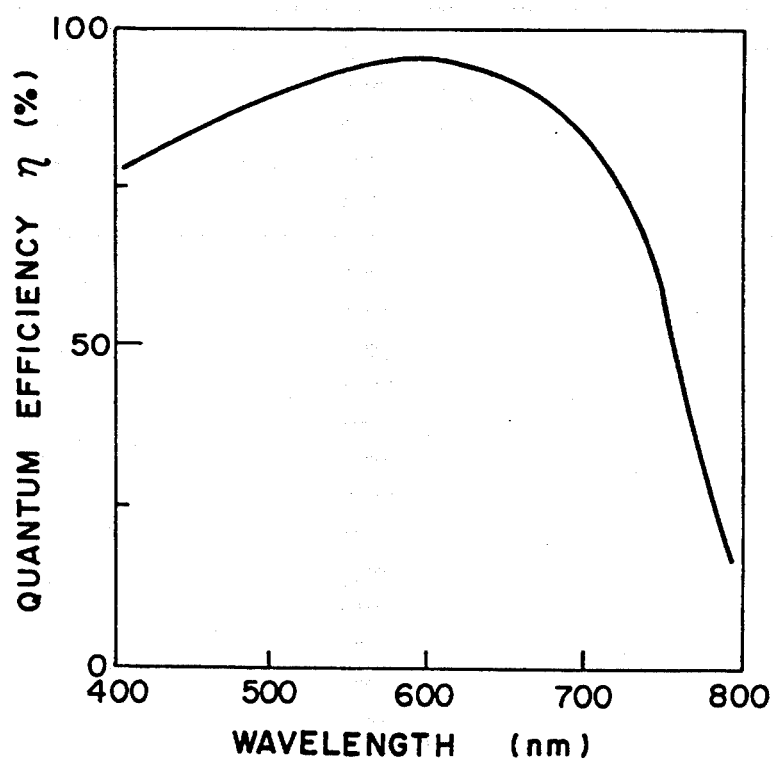

FIGS. 5 and 6 show respectively current-voltage characteristics and quantum efficiencies $\eta$ observed at a light state and a dark state respectively of the image sensor element. With this sensor, as readily understood from the graphs, the light and dark ratio in the order of $10^5$ has been obtained at 2 V biasing, and also a quantum efficiency higher than about 0.80 has been obtained over a wide range of wavelengths of 400~700 nm.

Figure 7:
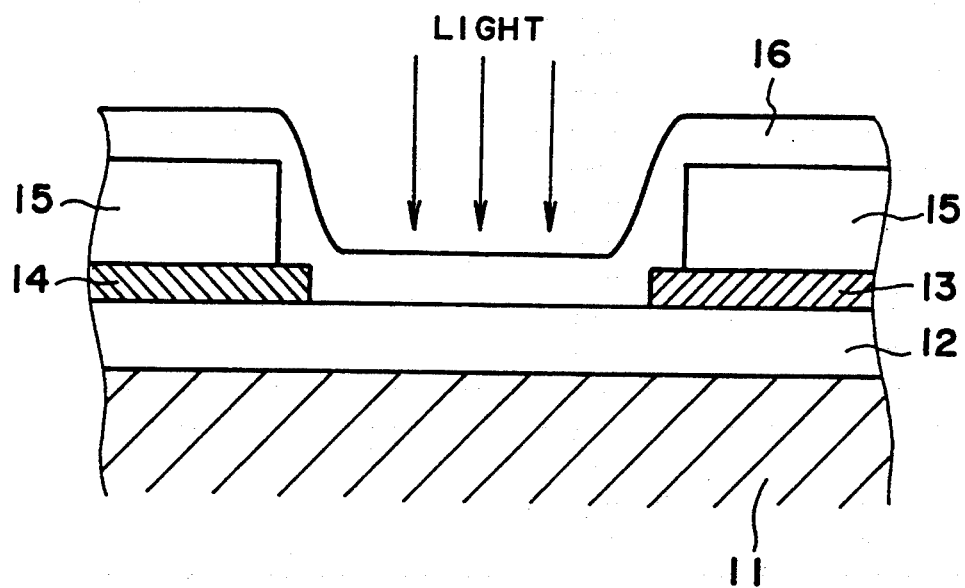
FIG. 7 is a diagrammatic sectional view of a structure of a second embodiment according to the invention.

FIG. 7 shows in a sectional view a structure of a second embodiment of the invention. The image sensor element is fabricated in the manner described hereinafter.

On the glass substrate 11 (Corning #7059), an amorphous silicon film 12 having a thickness of 5000 Angstroms is formed under the same conditions as in the first embodiment. Further, by the plasma-assisted CVD process, an n+-layer having a thickness of 400 Angstroms is formed under the conditions of gas mixing ratio ($SiH_4H_2$) of 0.33, silane gas flow rate of 40 SCCM, 0.5% phosphine of 10 SCCM, electron discharge output power of 80 W, gas pressure of 80 Pa and substrate temperature of 250° C. Then, by using a photoresist, the boron ions are implanted at the patterned region 14 under the same conditions as in the first embodiment. Thereafter, after the removal of the photoresist, the chromium film is formed as in the first embodiment followed by the formation of an electrode 15. Then, the n+-layer remaining between the electrodes 15 is removed using a reactive ion etching (RIE) process and finally a nitride silicon film 16 as a protective film is formed on an entire resulting surface. The fabrication of the sensor is thus completed. The RIE process mentioned above has been performed under chamber temperature of 80° C., flow rate ratio between etching gases of $CF_4+O_2$ of 27/3, and electron discharge output power of 200 W.

Figure 8:
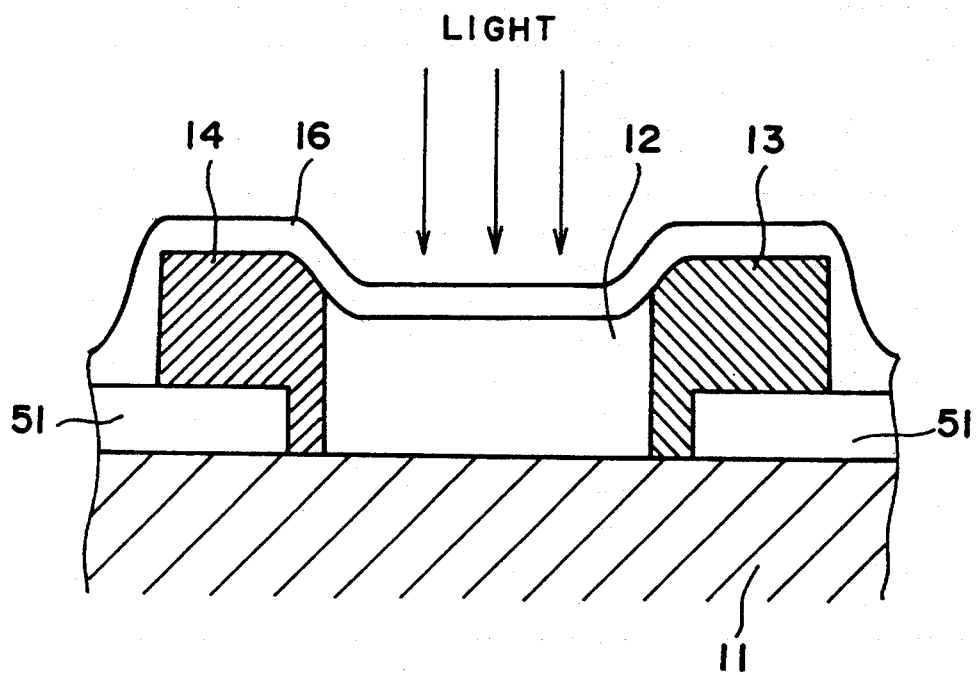
FIG. 8 is a diagrammatic sectional view of a structure of a third embodiment according to the invention.

FIG. 8 shows in a schematic sectional view a structure of a third embodiment according to the invention. The image sensor element therein is fabricated in the manner described hereinafter.

On a glass substrate 11, electrodes 51 are formed and are patterned. Thereafter, as in the first embodiment, an amorphous silicon film 12 of 1 micronmeter is formed and boron and phosphorus are respectively implanted as in the first embodiment, at the regions 13 and 14. The amorphous silicon film 12 is made to have an island shape and, then, a nitride silicon film 16 is formed as a protective layer. In this way, it is possible to increase the thickness of the amorphous film 12, thereby enhancing the amount of absorption with respect to red region of light (up to 7500 Angstroms).

Figure 9:
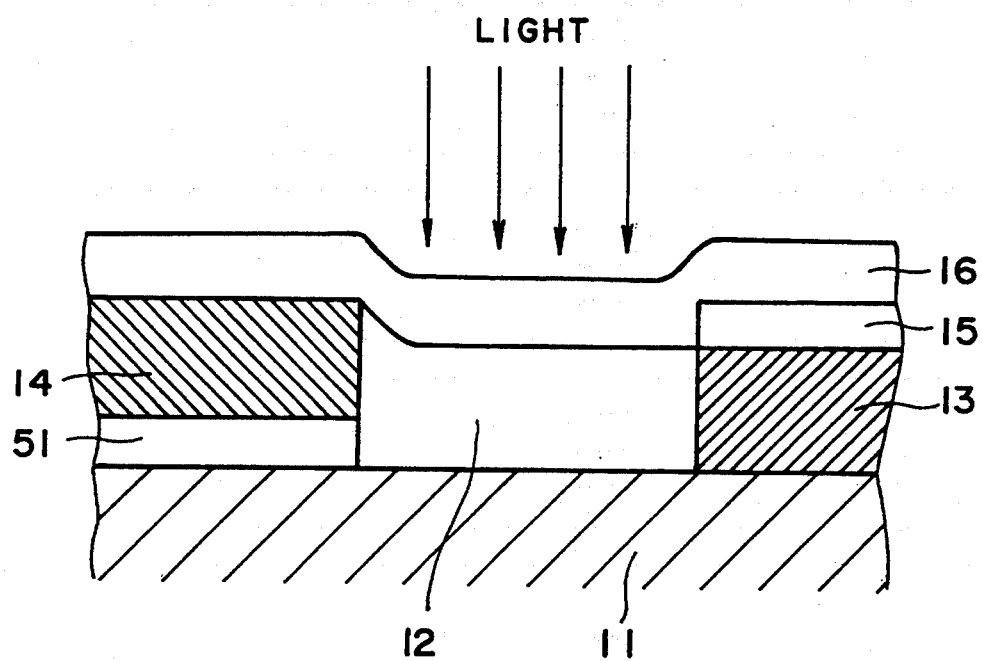
FIG. 9 is a diagrammatic sectional view of a structure of a fourth embodiment according to the invention.

FIG. 9 shows in a schematic sectional view a structure of a fourth embodiment according to the invention. The fabrication of the image sensor element follows the following steps.

On a glass substrate 11, an electrode 51 is formed followed by the formation of an amorphous silicon film 12 of 5000 Angstroms. Then, using a photoresist, boron and phosphorus are respectively implanted at regions 13 and 14 under the same conditions as in the first embodiment. Thereafter, an electrode 15 is formed and finally a protective film 16 is formed, thereby completing the fabrication of the image sensor. This structure can also be advantageously used when connecting the electrode 51 or 15 with a switching element, ICs, etc. In this embodiment, the positions as to right and left of n+-layer or p+-layer, or the positions as to upper or lower of the electrode 51 or electrode 15 may be changed optionally.

Figure 10:
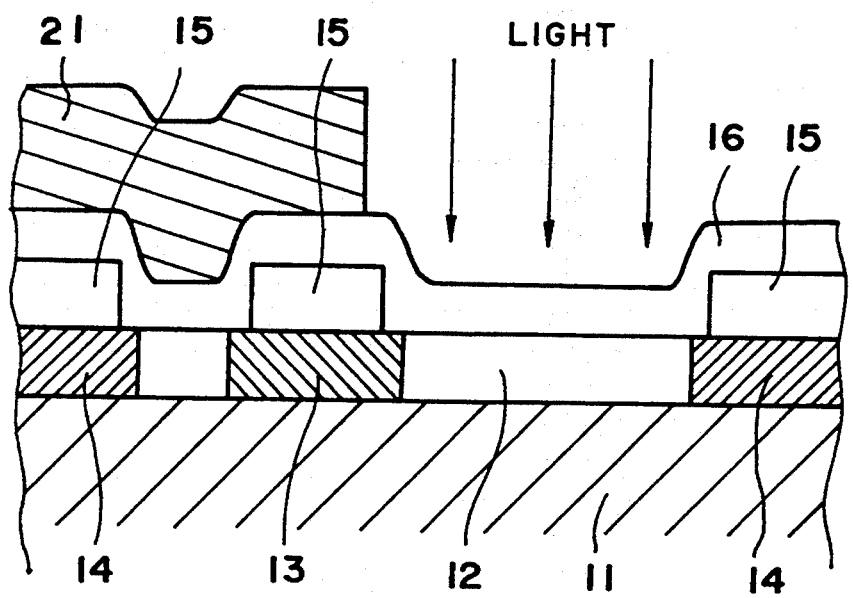
FIG. 10 is a diagrammatic sectional view of a photo image sensor device of a fifth embodiment according to the invention, in which a photo sensor of a planar type and a blocking diode are formed in the same step and are connected together.
Figure 11:
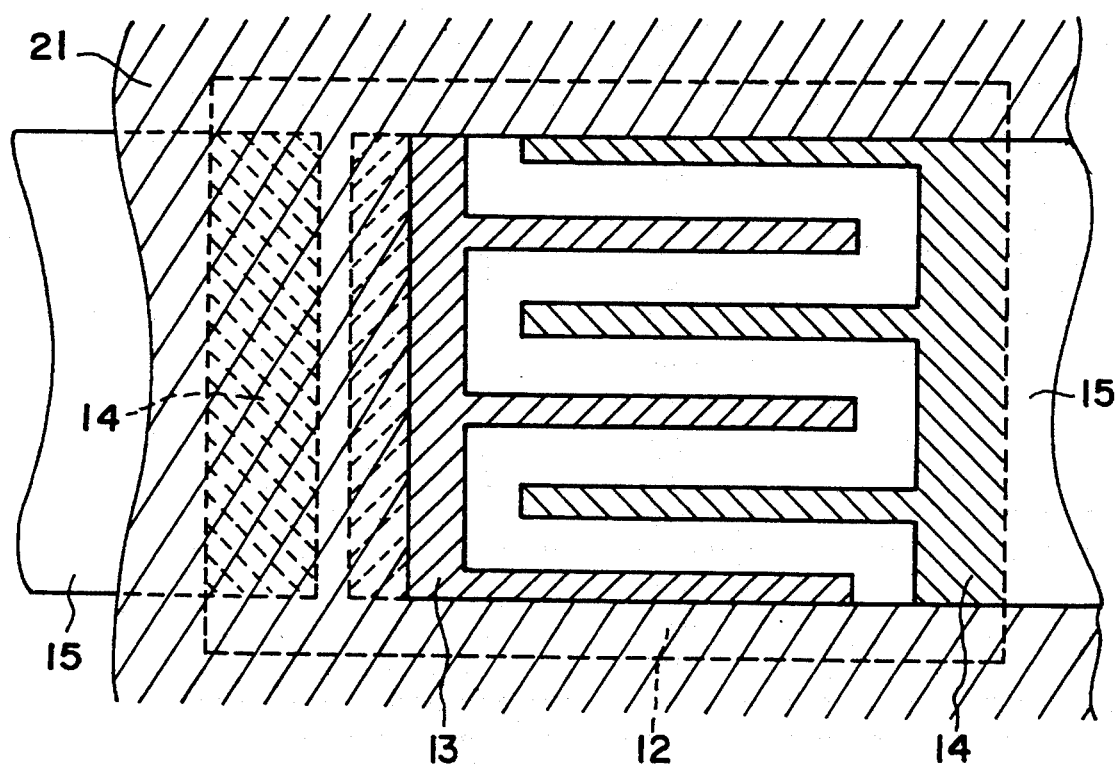
FIG. 11 is a diagrammatic plan view of the photo image sensor device of the fifth embodiment according to the invention.

FIGS. 10 and 11 show respectively in a plan view and a sectional view a structure of a pin-type image sensor device of a fifth embodiment wherein a blocking diode as a switching element is connected, in a back-to-back way, to a photo sensor element. In FIG. 10, the regions 14 (two positions per element) are ion-implanted with phosphorus for n+-impurity and the region 13 is ion-implanted with boron for p+-impurity under the same conditions as in the first embodiment. Also, on the blocking diode, a protective film 18 is formed and then a light blocking film 21 is formed for blocking the light incident thereon. The capacitance ratio between the blocking diode and the sensor element is so designed as to be 1:10 but, in optimizing the photocurrent value, it is necessary to make variations in such capacitance ratio in a range between 1:5 and 1:15 in order to optimize the film thickness, the amount of incident light, etc. In this embodiment, the structure is the same as that of the first embodiment but it is not precluded from employing the structure as in any of the second, third or fourth embodiment.

Figure 12:
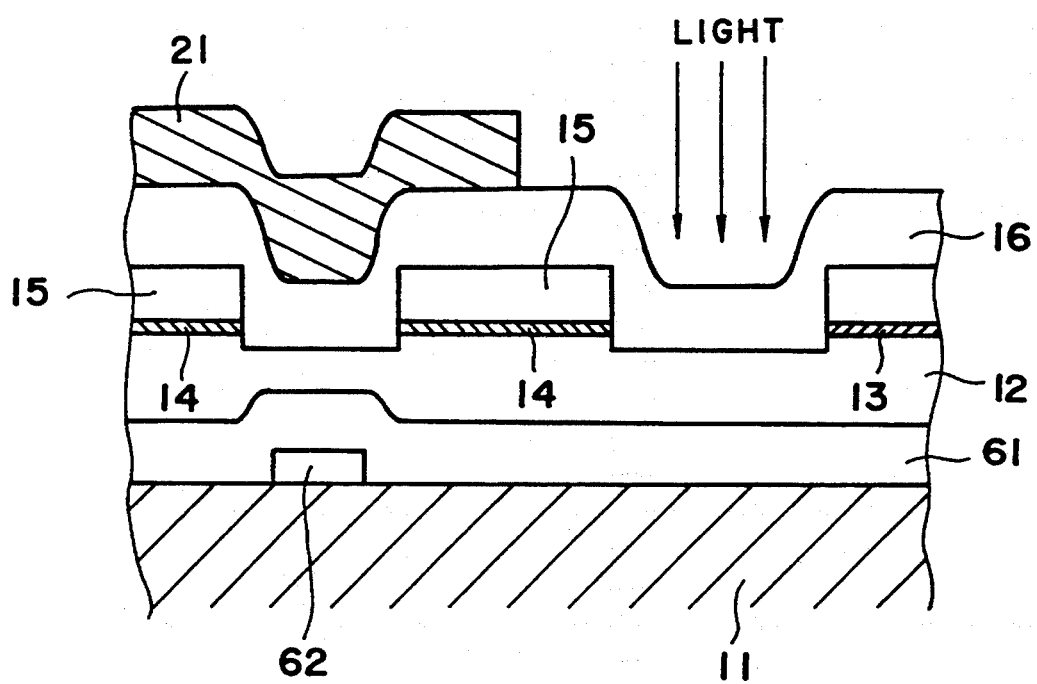
FIG. 12 is a diagrammatic sectional view of a photo image sensor device of a sixth embodiment according to the invention, in which a photo sensor of a planar type and a field effect transistor are formed in the same step and are connected together.

FIG. 12 shows in a sectional view an image sensor device of a sixth embodiment wherein a TFT switch and a pin-type photo diode are interconnected. In this embodiment, a bottom gate type n-channel TFT is used.

On a glass substrate 11, an electrode 62 is formed by a sputtering and wet-etching process, followed by sequential formation of an insulating film 61 of 3000 Angstroms, an amorphous silicon film 12 of 3000 Angstroms and an n+-silicon film 14 of 500 Angstroms, and then the ion-implantation is made at the region of the film 14 under the same conditions as in the first embodiment. Thereafter, electrodes 15 are formed and, by using these electrode 15 as masks, the unnecessary portions of the n+-layer are dry-etched. A nitride silicon film of 3000 Angstroms is formed as a protective film 16 and, at an upper portion of the TFT switch, a light blocking film 21 of 5000 Angstroms is formed. This completes the fabrication of the image sensor element of the type in which the driver TFT is integrally formed. In this embodiment, a bottom gate type TFT is used, but a top gate type TFT may well be used. Also, for the photoelectric conversion layer and the intrinsic layer of the TFT, crystalline silicon or microcrystalline silicon may be used instead of the amorphous silicon. In this embodiment, the structure of the second embodiment is used but the structure of any of the first, third and fourth embodiments may be used.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An image sensor having a pin planar type photodiode comprising:
   an insulating substrate;
   a photoelectric conversion layer provided on said insulating substrate;

a pair of electrodes provided over said insulating substrate; and a p-type region and an n-type region respectively provided to said pair of electrodes at locations at which light incident on an upper surface of said photoelectric conversion layer is unintercepted, said p-type region and said n-type region having their upper surfaces at a level not lower than the unintercepted upper surface of said photoelectric conversion layer.

2. The image sensor according to claim 1, in which said photoelectric conversion layer is disposed between said p-type and n-type regions, and said pair of electrodes respectively are disposed on said p-type and n-type regions.

3. The image sensor according to claim 1, in which said p-type and n-type regions are disposed on said photoelectric conversion layer, and said pair of electrodes are respectively disposed on said p-type and n-type regions.

4. The image sensor according to claim 1, in which one of said pair of electrodes is disposed on said insulating substrate with one of said n-type and p-type regions being stacked thereon, and the other one of said n-type and p-type regions is disposed on said insulating substrate with the other one of said pair of electrodes being stacked thereon.

5. The image sensor according to claim 1, further comprising a transparent protective layer covering said photoelectric conversion layer, said pair of electrodes and said n-type and p-type regions.

6. An image sensor in which two pin-type photo sensors are in one of back-to-back and front-to-front interconnections with one of said two sensors being used as a blocking diode, said image sensor comprising as said pin-type photo sensor:

an insulating substrate;

a photoelectric conversion layer provided on said insulating substrate;

a pair of electrodes provided over said insulating substrate; and a p-type region and an n-type region respectively provided to said pair of electrodes at locations at which light incident on a surface of said photoelectric conversion layer is unintercepted.

said two pin-type photo sensors having in common one of said electrodes to which one of said p-type region and said n-type region is provided.

7. The image sensor according to claim 6, further comprising a light blocking film which covers an upper portion of said one of said two sensors functioning as the blocking diode.

8. An image sensor in which a thin-film field effect transistor and an pin-type photo sensor of a lateral type are provided on an insulating substrate, said thin-film field effect transistor and said pin-type photo sensor having an amorphous silicon layer in common and said photo sensor having an electrode in common with one of source and drain electrodes of said thin-film field effect transistor, said pin-type photo sensor comprising:

an insulating substrate;

a photoelectric conversion layer provided on said insulating substrate;

a pair of electrodes provided over said insulating substrate; and a p-type region and an n-type region respectively provided to said pair of electrodes at locations at which light incident on a surface of said photoelectric conversion layer is unintercepted, one of said electrodes having one of said p-type region and said n-type region being electrically connected with one of said source and drain electrodes of said field effect transistor.

9. The image sensor according to claim 8, further comprising a light blocking film which covers an upper portion of said thin-film field effect transistor.

* * * * *